United States Patent [19]

Le Rouzic et al.

[11] 4,285,781

[45] Aug. 25, 1981

[54] METAL SUPPORT FOR AN ELECTRONIC COMPONENT INTERCONNECTION NETWORK AND PROCESS FOR MANUFACTURING THIS SUPPORT

[76] Inventors: Jean Le Rouzic, 23, rue de Bourgogne, 22300 Lannion; Loic Demeure, Route de Pleumeur, 22700 Perros-Guirec; Yvon Le Roux, Le Rhu-Servel, 22300 Lannion, all of France

[21] Appl. No.: 156,263

[22] Filed: Jun. 3, 1980

[30] Foreign Application Priority Data

Jun. 15, 1979 [FR] France ................................ 79 15398

[51] Int. Cl.³ .............................................. C25D 11/04
[52] U.S. Cl. ........................................ 204/15; 204/34; 427/34
[58] Field of Search ................... 427/34; 204/15, 38 A

[56] References Cited

U.S. PATENT DOCUMENTS

| | | | |
|---|---|---|---|
| 3,607,381 | 9/1971 | Fairbairn | 427/34 |
| 3,699,011 | 10/1972 | Nishimura | 204/38 A |
| 3,935,083 | 1/1976 | Tomozawa et al. | 204/38 A |
| 3,941,630 | 3/1976 | Larrabee | 204/38 A |
| 4,133,724 | 1/1979 | Hartnagel et al. | 204/38 A |

*Primary Examiner*—R. L. Andrews
*Attorney, Agent, or Firm*—Lane, Aitken, Kice & Kananen

[57] ABSTRACT

In a support for an electronic component interconnection network, a metal substrate coated with a layer of aluminium of granular structure, whose thickness may vary between a few microns and a few tens of microns, this layer being anodized.

8 Claims, 8 Drawing Figures

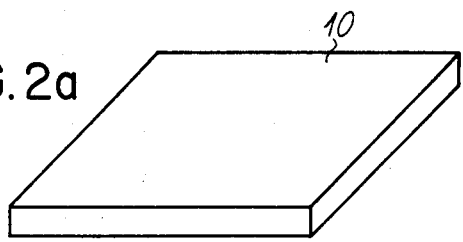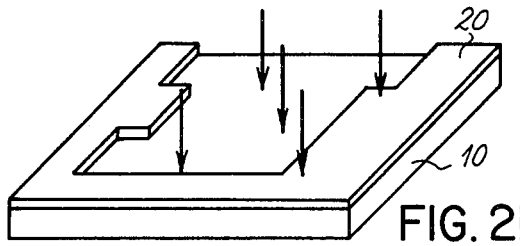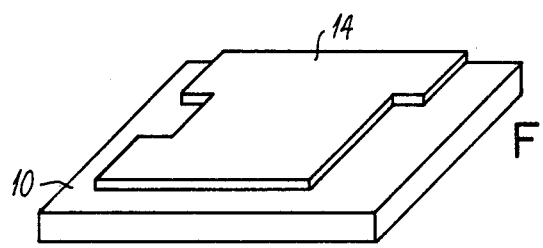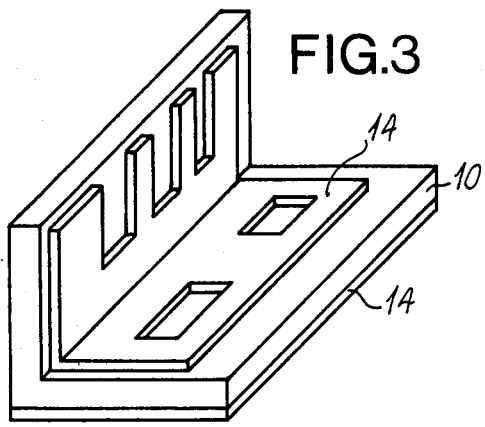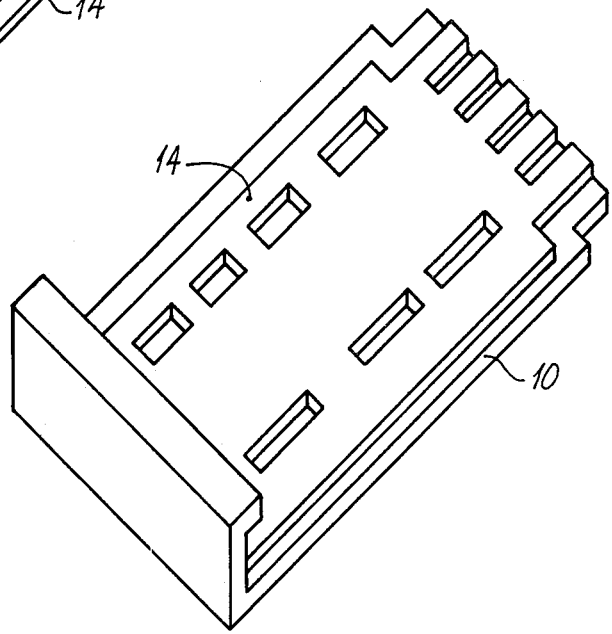

METAL SUPPORT FOR AN ELECTRONIC COMPONENT INTERCONNECTION NETWORK AND PROCESS FOR MANUFACTURING THIS SUPPORT

The present invention relates to a metal support for an electronic component interconnection network and to a process for manufacturing this support. It finds particular application in microelectronics.

In the domain of microelectronics, a certain number of component interconnection circuits are presently produced employing hybrid technology.

A hybrid circuit is composed of an insulating support, generally of mineral origin, on which are deposited conducting linkage layers and passive components (resistors, capacitors, inductances) or active components (semi-conductors, integrated circuits) connected by welding or brazing.

Two techniques are presently used for making such hybrid circuits: by thin layer or thick layer.

Thin layer circuits are made from an insulating support on the surface of which layers which serve to form the circuit are deposited by different processes (evaporation, cathode sputtering, chemical deposit, cracking, pyrolysis, etc . . . ). After the deposit of each layer, a selective etching operation (chemical or electrochemical) through a mask enables the circuit to be made.

In the particular cases of very simple structures, a direct deposit through a mask may be envisaged.

Thick layer circuits are made by direct printing on an insulating support of conducting, resistant or insulating pastes or inks, by means of conventional silk screen processes. The support, after having received its print, is baked until the deposit is perfectly bonded thereto. At present, the main inks used bake at high temperatures, greater than 650° C., this obliging the substrate to withstand a temperature at least as high. However, inks with a low baking point have appeared, for example polymer inks, which bake at about 200° C.

Whatever the technique chosen, thin layer or thick layer, the insulating supports used are presently glasses or ceramics, such as alumina or beryllium oxide and, in certain particular cases, sapphire. All these supports present drawbacks:

glasses and aluminas are fragile supports, poor heat dissipators and are relatively expensive;
beryllium oxide has a good heat conductivity but it is highly toxic when used and is also expensive,
sapphire, although advatageous from the thermal point of view, has a prohibitive price.

Furthermore, all these supports are of small dimensions (1 dm$^2$ for the largest) due to their fragility and difficulty of manufacture.

As in microelectronics the tendency is always to have a greater integration of components, and one is inevitably confronted with the problem of dimensions of the substrates and of their thermal dissipation.

To benefit from a better thermal dissipation, it appears advantageous to use metals as base support. The use thereof is possible on condition that they are coated wwith a thin insulating layer which may receive the deposits necessary for making the interconnection circuit.

Among the metals that may be used in this application, aluminium is of particular interest. In fact, this metal is a good heat conductor, it is not very fragile, its price is moderate and its oxide $Al_2O_3$ is a good insulating material.

In addition, this oxide is easily obtained on the surface of an aluminium substrate by the anodizing process. The layer of oxide which may be obtained has a thickness which may vary between a few microns and a few tens of microns, depending on the desired insulation and maintaining voltage.

However, this layer of alumina presents a serious drawback as it does not withstand thermal shocks well. In fact, for temperatures greater than 130° C., a multitude of cracks appears on such a layer of alumina; this phenomenon is known as "cracking". These cracks are largely due to the difference in coefficients of expansion between the aluminium and its oxide. They cause defects in insulation and in maintaining voltage, rendering this type of support unusable in component interconnection networks.

The same phenomenon appears if the alumina is obtained from a fine sheet of aluminium laminated on another metal.

Another method may be used for coating a metal with a fine layer of alumina; it consists in projecting an alumina powder thereon, using a plasma arc spray for example.

The layers thus obtained generally have a good appearance and good behaviour with respect to thermal shocks, but they are never free from porosity, hence possible defects in insulation and maintaining voltage.

It is precisely an object of the present invention to provide a support which does not present these drawbacks.

The invention relates to a support for an electronic component interconnection network comprising a metal substrate coated with a layer of aluminium of granular structure, the thickness of which may vary between a few microns and a few tens of microns, this layer being anodized.

The metal substrate is preferably rolled aluminium.

The invention also relates to a process for manufacturing this support, wherein a metal substrate has a layer of aluminium of granular structure deposited thereon, then said layer is anodized.

The deposit of aluminium of granular structure is preferably effected by plasma arc spray ffrom an aluminium powder.

This technique is described in particular in French Patent No. 74 27313 applied for on Aug. 6, 1974 and entitled 'Manufacture of circular wave guides with dielectric coating'.

Anodizing presents the particularity of creating a layer of alumina whose volume is greater than the volume of the metal which produced it. This swelling makes it possible to obtain a layer of alumina without porosity which may or may not be clogged.

The layer of alumina thus obtained on the metal support, which is for example rolled aluminium, may be subjected to considerable thermal shocks without deteriorating. The upper limit is fixed by the melting point of the coated metal.

This technology of metal support coated with a layer of alumina obtained from a deposit of anodized aluminium of granular structure makes it possible to produce excellent supports, inter alia for hybrid circuits. In fact, these supports have a very good thermal dissipation,
may be mass produced with suitable industrial equipment, this leading to a low cost price, resist thermal shocks well,
have good electrical and mechanical characteristics,
allow the deposit and its anodizing to be effected partially on the surface of the metal support, this enabling thermal and electrical connections having better characteristics to be made.

In the particular case of the base metal itself being aluminium, this type of support may be used as a support of thick layer hybrid circuits attaining large dimensions and using serigraphic inks not requiring a high baking temperature. These products are suitable for development due to the energy saving that they promote, compared with inks with high temperature baking.

By way of example, a support having the following characteristics may be produced:

Base aluminium used

Optical polished A5, thickness 1 mm

Characteristics of the deposit of aluminium of granular structure deposit on base aluminium by plasma arc spary in vacuo from a powder of aluminium of granulometry $< 10$ $\mu$m,
thickness deposited: 25 $\mu$m
surface state 50$\mu$ CLA (Center Line Average)

Conditions of oxidation of the layer of aluminium oxidation bath of sulphuric type, concentration 150 g/liter
temperature of the bath during oxidation: 20° C.$\pm$0.5° C.
constant current density: 1.5/A dm$^2$
current applied solely on the layer of aluminium deposited,
oxidation time: 30 minutes Characteristics of the layer of alumina obtained oxidised thickness: 12 $\mu$m
adherence of the layer of Al$_2$O$_3$: greater than 5 kg/mm$^2$
maintaining voltage 400 volts
insulation resistance under 250 volts: 10 G$\Omega$
no cracking of the layer after rapid variation of temperature test between $-25°$ and 400° C. (2 chamber method)

The invention will be more readily understood on reading the following description with reference to the accompanying drawing in which:

FIG. 2a illustrates a base support of aluminium at the beginning of a process of manufacturing a support according to the present invention using a mask.

FIG. 2b shows the substrate of FIG. 2a with the mask in place.

FIG. 2c shows the substrate of FIG. 2b with a layer of aluminium in place and the mask removed.

FIG. 3 shows an embodiment of a shaped piece.
FIG. 4 shows another embodiment of a shaped piece.

Figure 1A:
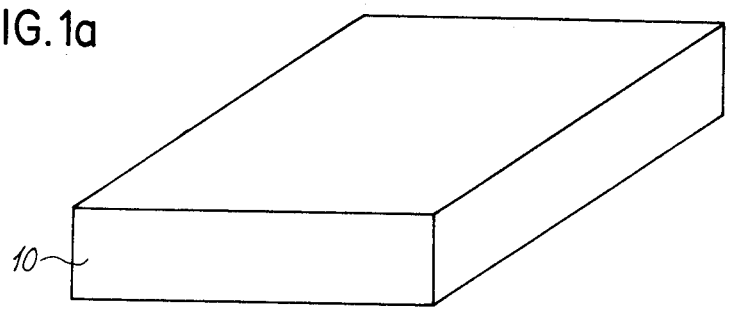
FIG. 1a illustrates the starting substrate in the manufacture of a support according to the present invention.
Figure 1B:
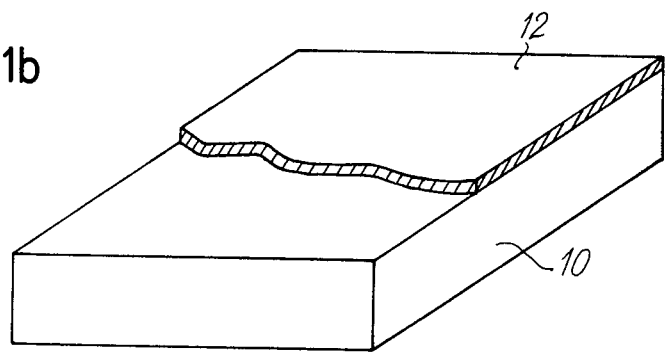
FIG. 1b shows the substrate of FIG. 1a coated with a layer of aluminium of granular structure.
Figure 1C:
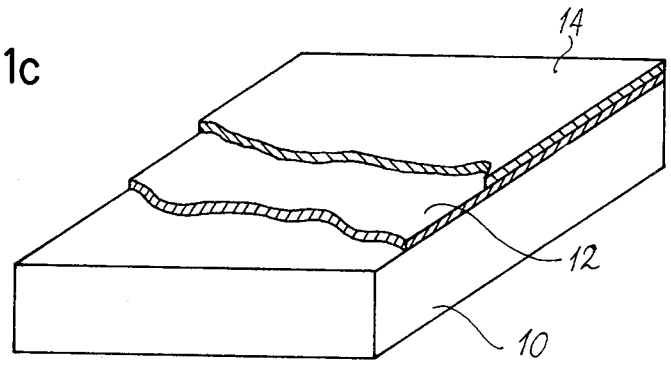
FIG. 1c shows a layer of alumina formed on the layer of aluminium of FIG. 1b.

Referring now to the drawings, FIG. 1 illustrates the different phases of manufacture of this support
at (a), the starting substrate 10 is made of aluminium
at (b), this substrate is coated with a layer 12 of aluminium of granular structure
at (c), a layer of alumina 14 is made on the layer 12 by anodizing.

In a certain number of applications, it may be advantageous to be able to have direct access to the support, either for establishing thermal contacts by directly mounting the dissipator element, or for establishing electrical connections such as for example taking a reference potential, or, finally, if only a part of a shaped piece is intended to receive a network of conductors.

The process of the invention is perfectly applied to these different cases. It employs masking techniques, known per se, generally making use of photopolymers.

The essential phases of the process are illustrated in FIG. 2. A base support 10 made of aluminium is taken (a). A layer of aluminium of granular structure is then deposited through a mask 20 (b), then anodizing is effected. It then remains to eliminate the mask by peeling or, better, by dissolution in a suitable solvent, which avoids tearing particles of alumina at the interface lines. Thus, insulated zones adapted to receive an electric circuitry and, on the other hand, zones allowing the support to appear, are obtained (c).

FIGS. 3 and 4 show two embodiments of shaped pieces on which is effected a deposit of anodized aluminium of granular structure.

What is claimed is:

1. In a support for an electronic component interconnection network, a metal substrate coated with a layer of aluminium of granular structure, whose thickness may vary between a few microns and a few tens of microns, this layer being anodized.

2. The support of claim 1, wherein the metal substrate is rolled aluminium.

3. The support of claim 1, wherein the layer of aluminium oxide only partially occupies the surface of the support.

4. The support of claim 1, wherein the layer of alumina is coated with surface deposits producing by subtractive method an electronic component interconnection network.

5. The support of claim 1, wherein the layer of alumina is coated with selective surface deposits producing by additive method an electronic component interconnection network.

6. Process for manufacturing the support of claim 1, comprising the steps of taking a metal substrate, depositing thereon a layer of aluminium of granular structure, then effecting an anodizing of said layer.

7. The process of claim 6, wherein the deposit of aluminium of granular structure is effected by means of plasma arc spray from an aluminium powder.

8. The process of claim 6, wherein the deposit of aluminium of granular structure and anodizing are effected through masks allowing directly accessible zones to exist on the substrate.

* * * * *